PHOTOSENSITIVE DIODE ARRAY ACCESSED BY A METAL OXIDE SWITCH UTILIZING OVERLAPPING AND TRAVELING INVERSION REGIONS

Filed Feb. 24, 1965 2 Sheets-Sheet 1

INVENTOR.
LOUIS J. KABELL
BY
ATTORNEY

INVENTOR.
LOUIS J. KABELL
BY
ATTORNEY

United States Patent Office 3,378,688
Patented Apr. 16, 1968

3,378,688

PHOTOSENSITIVE DIODE ARRAY ACCESSED BY A METAL OXIDE SWITCH UTILIZING OVERLAPPING AND TRAVELING INVERSION REGIONS

Louis J. Kabell, Palo Alto, Calif., assignor to Fairchild Camera and Instrument Corporation, Syosset, N.Y., a corporation of Delaware Filed Feb. 24, 1965, Ser. No. 434,916
12 Claims. (Cl. 250—211)

This invention relates to a solid state photosensitive device and in particular to a photosensitive diode coupled to a metal oxide silicon (hereinafter referred to as a MOS) switch to be operated in the storage mode. The photosensitive diodes are arranged in an array wherein a particular diode may be accessed by two overlapping and traveling inversion regions.

It has been known that in the prior art a spatial distribution of light intensity along a single line of defined width may be sensed and converted into an electrical signal proportional to the incident light intensity. This has been accomplished by electronic cathode ray camera tubes, such as image orthicons or vidicon tubes. Another prior art arrangement employs solid state photodiodes or photoconductors arranged in a linear array and sequentially connected to a detecting circuit by switches.

Electronic camera tubes require a complex array of components and circuits in order to focus the electronic beam and to cause the beam to sweep in a proper fashion. Included in these complex components and circuits are such devices as focusing coils, deflection shields, sweeping drive amplifiers, linear sweep generator circuits, shading correction circuits and dynamic focusing circuits. Solid state arrays on the other hand require a switch for each element in the array and means for actuating each switch in proper time sequence. As the number of elements in the array becomes large, the complexity of the switching means becomes unwieldy. For example, a two hundred photodiode linear array could be constructed with length of approximately one-half inch but would require sequential switching on the order of six or seven 4" x 5" printed circuit cards.

One specific prior art configuration has attempted to avoid some of the prior art shortcomings by combining an electron beam gun and an array of solid state photodiodes. This arrangement is described in detail in U.S. Patent 3,011,089 issued to F. W. Reynolds on November 28, 1961. Briefly, that device operates in what is known as the storage mode. In this mode of operation, the photosensitive PN junction is initially reverse biased and a charge stored in the junction capacitance. Once the reverse bias is removed and the junction open circuited, the PN junction (without light incident thereto) will discharge at a relatively slow rate. Typically 1.5 seconds or more are required for the junction to discharge. With light incident upon the PN junction, electron-hole pairs are created which will increase the rate of discharge of the charge stored in the junction in proportion to the light incident thereto. In room light (15 foot candles), the PN junction will discharge in about 0.2 second. Thus, when the junction is again reverse biased after being exposed to light, the current that flows is a measure of the light incident to the junction during the interval between successive reverse biasing, referred to as the sampling interval.

The storage mode of operation has improved sensitivity, but as employed in prior art devices, it has had the shortcoming of requiring an electron beam gun. In this respect it has the same disadvantages that are attendant to conventional electronic camera tubes. It was previously thought necessary to employ an electron beam gun as a switch to isolate the junction and prevent its discharge by spurious leakage paths. Such leakage causes deterioration of the photon induced electron-hole pair generation process. For example, the connecting of an ordinary switching transistor to the photosensitive diode would enable the charge stored in the junction to leak therefrom at a rate which would substantially affect the operation of a photosensitive diode operating in the storage mode. More specifically, the resistance of an ordinary switching transistor in the open condition would not contribute sufficient resistance to the RC circuit formed by it and the diode junction capacitance. The time constant that results with such a combination does not prevent discharge of the junction during the sampling interval to the extent necessary for acceptable operation.

The device of this invention overcomes the prior art complexity eliminating the need for an electron beam gun or similar arrangement and decidedly simplifying the switching array necessary to access the array of photodiodes. This array requires only four terminal connections to provide the scanning function and two terminal connections to provide biasing for the photodiodes. A plurality of photodiodes and a plurality of MOS are formed in the same wafer. A particular MOS is closed and is connected to a photodiode by a pair of traveling overlapping inversion regions.

It is known in the prior art that a semiconductor of one conductivity type will invert to the opposite conductivity type in a limited region when an appropriate voltage applied to an inversion plate insulated from the semiconductor region. The inverted region, which is referred to as the inversion region, is a conductive region in what was before a resistive region. By overlapping two inversion regions and then expanding one inversion region and contracting the other inversion region, a moving conductive layer is formed which may controllably connect a selected photodiode to a biasing means.

In addition to minimizing the complexity of a photosensitive array, the subject array is consistent with solid state processes and techniques which enable very small reliable devices to be mass produced. The device also provides a means for operating a photodiode in the storage mode with increased sensitivity but without the necessity for using an electron beam gun. The use of a MOS in combination with a photodiode provides an RC circuit for the stored charge having a very large time constant. Thus, the leakage current does not substantially affect the sensitivity of the storage mode of operation. The MOS is also consistent with the traveling inversion layer concept of accessing.

Briefly, the structure of the invention comprises a photosensitive diode, a MOS connected to said photosensitive diode to apply a reverse bias when closed and to couple a very large resistance in circuit with said photosensitive diode when open. With respect to the array aspect of the invention, the structure employed comprises an elongated PN junction, a first plurality of PN junctions, a second plurality of PN junctions and means for selectively connecting at least one of the PN junctions from the first plurality with at least one of the PN junctions from the second plurality and with the elongated junction. The means for selectively connecting includes a pair of overlapping traveling inversion layers.

The above generally described structure and advantages along with other advantages of this invention are completely described in the detailed description which follows and the accompanying drawings wherein.

Figure 1:
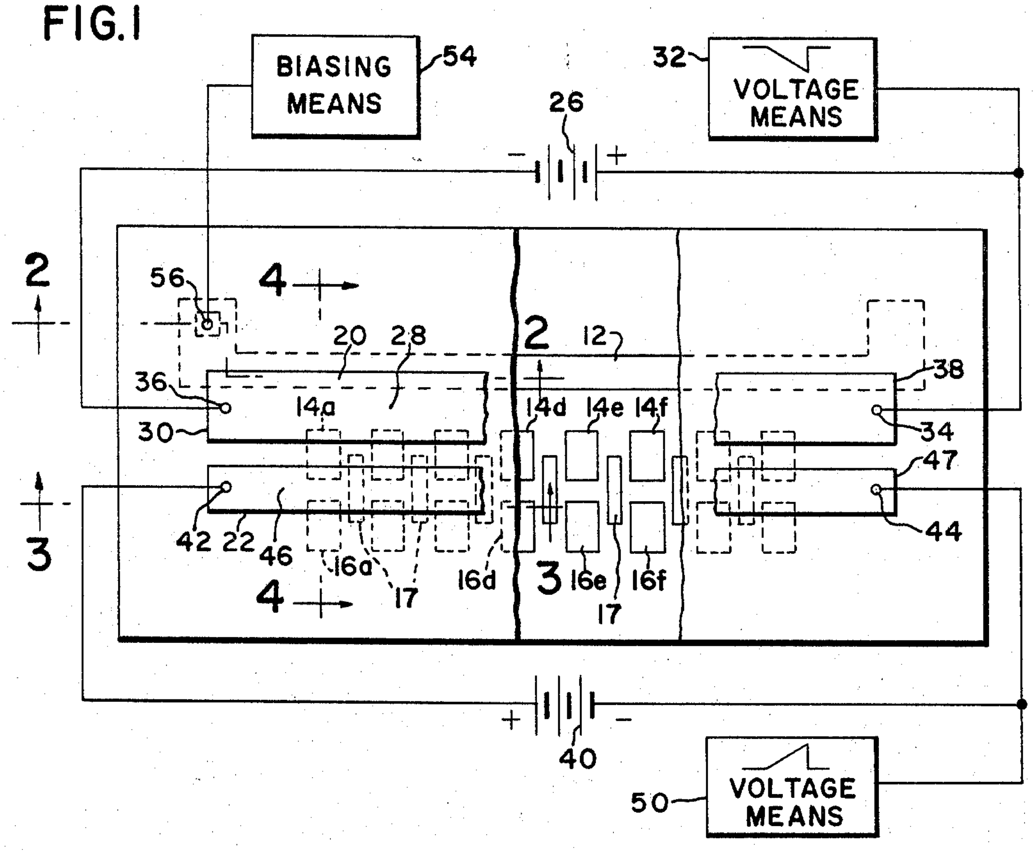
FIG. 1 is a plan view of the array of the invention.
Figures 2, 3:
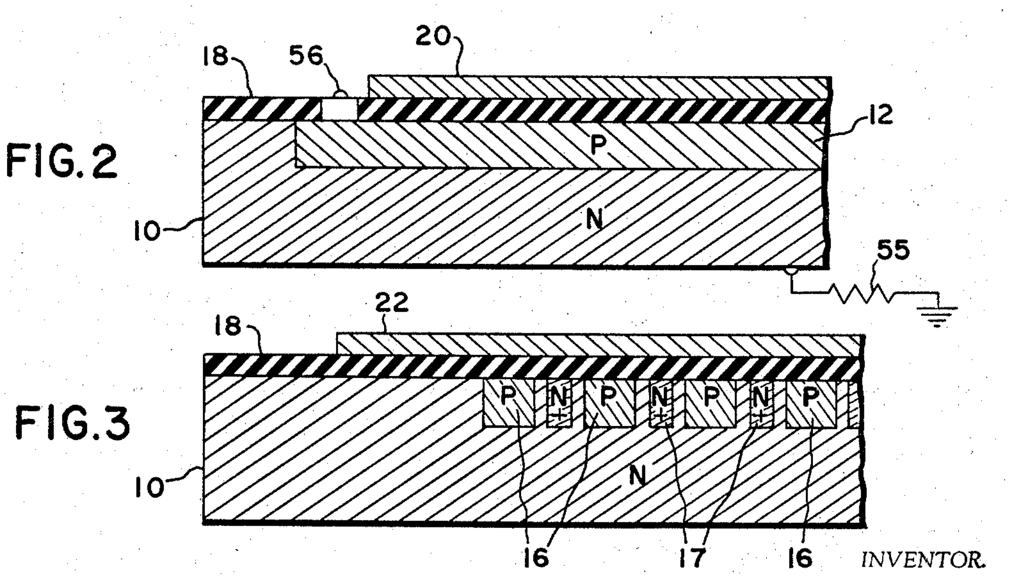
FIG. 2 is a section taken along the lines 2—2 of FIG. 1 showing the elongated junction, the insulating material and the inversion plate.
FIG. 3 is a sectional view taken along the lines 3—3 of FIG. 1 showing the second plurality of PN junctions separated by noninverting regions.
Figure 4:
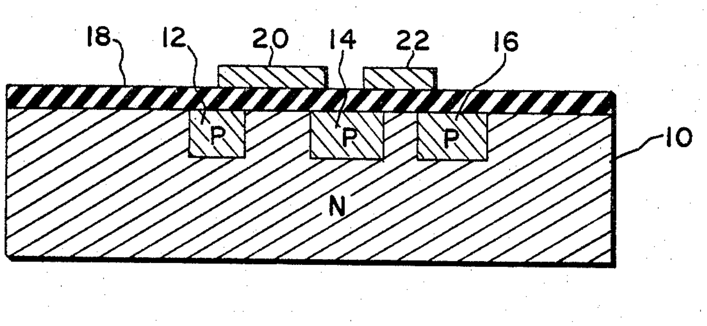

FIG. 4 is a sectional view taken along the lines 4—4 of FIG. 1 showing the elongated PN junction, one of the first plurality of PN junctions and one of the second plurality of PN junctions; and FIG. 5*a* to *c* are a series of simplified plan views showing the movement of the inversion region as one inversion region expands and the other contracts.

Referring to FIGS. 1–4, the photosensitive device comprises a wafer 10 of monocrystalline semiconductor material such as silicon having a first conductivity type. Typically, this may be an N-type conductivity formed by inclusion of impurities such as arsenic, antimony or phosphorous. An elongated semiconductor monocrystalline region 12 having a conductivity type opposite to that of wafer 10 is formed within wafer 10. Typically, region 12 may have a P-type conductivity that is formed by diffusing impurities such as boron, aluminum or indium into wafer 10. This elongated region 12 defines a contact for the photosensitive array and forms a PN junction with wafer 10.

A first plurality of discrete monocrystalline semiconductor regions 14 having a conductivity type opposite to that of wafer 10 and typically have a P-type conductivity are formed with wafer 10. The discrete regions 14 are located adjacent to elongated region 12 and are separated therefrom. A second plurality of discrete monocrystalline semiconductor regions 16 having a conductivity type opposite to that of wafer 10, typically a P-type conductivity, are formed adjacent said first plurality of discrete regions and separated therefrom. Discrete regions 14, region 16 and wafer 10 form PN junctions that are arranged in rows across wafer 10 and aligned in columns. The array includes a plurality of non-inverting regions 17 with at least one such region located between successive discrete regions 14 and 16 extending adjacent these regions. These regions have the same conductivity type as wafer 10 but a higher impurity concentration and consequently a higher inversion potential than wafer 10.

A layer 18 of insulating material, such as silicon dioxide in the case of a silicon wafer 10, covers at least part of wafer 10. A long narrow rectangular inversion plate 20 bridges elongated region 12 and discrete regions 14 and is separated therefrom by layer 18. The plate 20 may be constructed from a resistor material such as tin oxide or Nichrome.

The elongated region 12, discrete regions 14, insulating material 18 and inversion plate 20 cooperate to form a first array of MOS's (FIGS. 1 and 4). It should be understood that the MOS switch is not a transistor as it lacks the lead connection to region 14 necessary for such a device. Region 14 is completely covered by insulating material 18. The array is different from conventional structures in that elongated region 12 and inversion plate 20 are common to all the MOS's. This decidedly simplifies the connections necessary to complete the array and perform the scanning function. The operation and construction of MOS devices is well known in the art and described in such publications as "The Silicon Insulated-Gate Field-Effect Transistor" by S. R. Hofstein, Proceedings of the IEE, September 1963, pages 1190–1202 and U.S. Patent 3,102,230 issued to Dawon Kahng on August 27, 1963. Briefly, the operation of a MOS device is based on the fact that when its gate, that is the inversion plate 20, is biased negatively, electrons in the case of a P-type MOS device, will tend to be repelled out of the N-type silicon immediately beneath the inversion plate and holes will be attracted towards this region. If the plate is made negative enough, the normally N-type silicon wafer will invert to a P-type in the region close to the Si-$SiO_2$ interface. Thus, there will be a low resistance region connecting the elongated region 12 and the discrete region 14 when the MOS is in a closed condition when an inversion potential is applied to inversion plate 20. A very high resistance will exist between the elongated region 12 and discrete region 14 when a potential below the inversion potential is applied to plate 20. This resistance is preferably over $10^{12}$ ohms. The inversion plate input resistance ($R_{gs}$) is also very high and typically $10^{15}$ ohms.

A second inversion plate 22 is similar in construction to inversion plate 20 and is located between discrete regions 14 and 16 overlying part of both of these regions and separated from these regions by insulating layer 18. The discrete regions 14, discrete regions 16, insulating layer 18 and inversion plate 22 form a second array of MOS's with inversion plate 22 common to all MOS's and discrete regions 16 also functioning as photodiodes operated in a storage mode. The storage mode of operation will be considered later in the specification.

Inversion plate 20 has terminals 34 and 36 connected to a means 26 for applying a voltage gradient. The voltage applied by voltage gradient means 26 is selected so that a linear voltage gradient results with the inversion potential of wafer 10 existing in the vicinity of a point 28. Then the potential from point 28 to left end 30 of the inversion plate will be greater than the inversion potential. In the case of an N-type silicon this inversion potential is a relatively large negative potential. With an inversion potential existing along plate 20 from point 28 to end 30, an inversion region will exist in wafer 10 from a point on the surface of wafer 10 coincident with point 28 to a point on wafer 10 in the proximity of the end of plate 30. This inversion region will result in discrete region 14*a* being connected to the elongated region 12.

In addition to voltage gradient means 26, a voltage means 32 is connected to terminal 34 of first inversion plate 20. The voltage means 32 supplies a voltage such than an inversion potential will progressively be applied along the first inversion plate 20 extending from point 28 to the right end 38 of first inversion plate 20. Typically, voltage means 32 supplies a negative going ramp voltage, that is a voltage which linearly and negatively increases with time. This causes a negative inversion potential to progress along plate 20 from left to right until the entire plate has an inversion potential applied along its length. Ramp voltage means are well known in the art and described in patents such as U.S. Patent 3,011,068 issued to E. S. McVey on November 28, 1961.

The second inversion plate 22 has voltage gradient means 40 connected to its terminal 42 and 44. The voltage applied by voltage gradient means 40 is selected so that a linear voltage gradient results with an inversion potential initially existing along the entire length of second inversion plate 22. This may be achieved by applying a relatively high negative voltage across plate 22 so that a negative inversion potential will exist in the vicinity of point 46 and a potential substantially in excess of the inversion potential will exist at all points along the inversion plate to the right of point 46. With such potential conditions existing along plate 22, an inversion region beneath second inversion plate 22 will extend between all of the discrete regions 14 and 16 except where the noninverting regions 17 exist. The regions 17 have a concentration of impurities such that voltage gradient means 40 does not apply a potential to second inversion plate 22 sufficient to cause an inversion of these regions.

A voltage means 50 is connected to terminal 44 to apply a voltage such that a potential less than the required inversion potential is progressively applied along the plate 22. This potential progresses from point 46 to right end 47. The progressive reduction of the inversion potential results in the inversion region created in wafer 10 progressively contracting and connecting fewer and fewer discrete regions 14 and 16. Typically, voltage means 50 may accomplish this result by applying a positive going ramp voltage to plate 22. This ramp voltage is applied in synchronism with the ramp voltage applied by voltage means 32.

A biasing means 54 is connected to terminal 56 attached to elongated region 12 and completes a circuit via resistor 55 (FIG. 2) connected to wafer 10 and ground. The biasing means 54 will supply a reverse bias to regions 16 and the PN junction formed by this region and wafer 10. This reverse bias is supplied to the junction when an inversion region exists beneath plates 20 and 22 in line with a region 14 and a region 16. This accessing and connection of regions 14 and 16 to biasing means 54 will be better understood when the operation of the device is considered with reference to FIG. 5.

The semiconductor portion of the invention may be fabricated by well known techniques. For example, the regions 12, 14 and 16 may be formed by well known diffusion and photoengraving techniques such as is described in U.S. Patent 3,025,589 issued to J. A. Hoerni on March 20, 1962. The inversion plates and contact to region 12 may be formed by well known film techniques such as described in U.S. Patent 2,981,877 issued to Robert N. Noyce on April 25, 1961.

Figure 5:
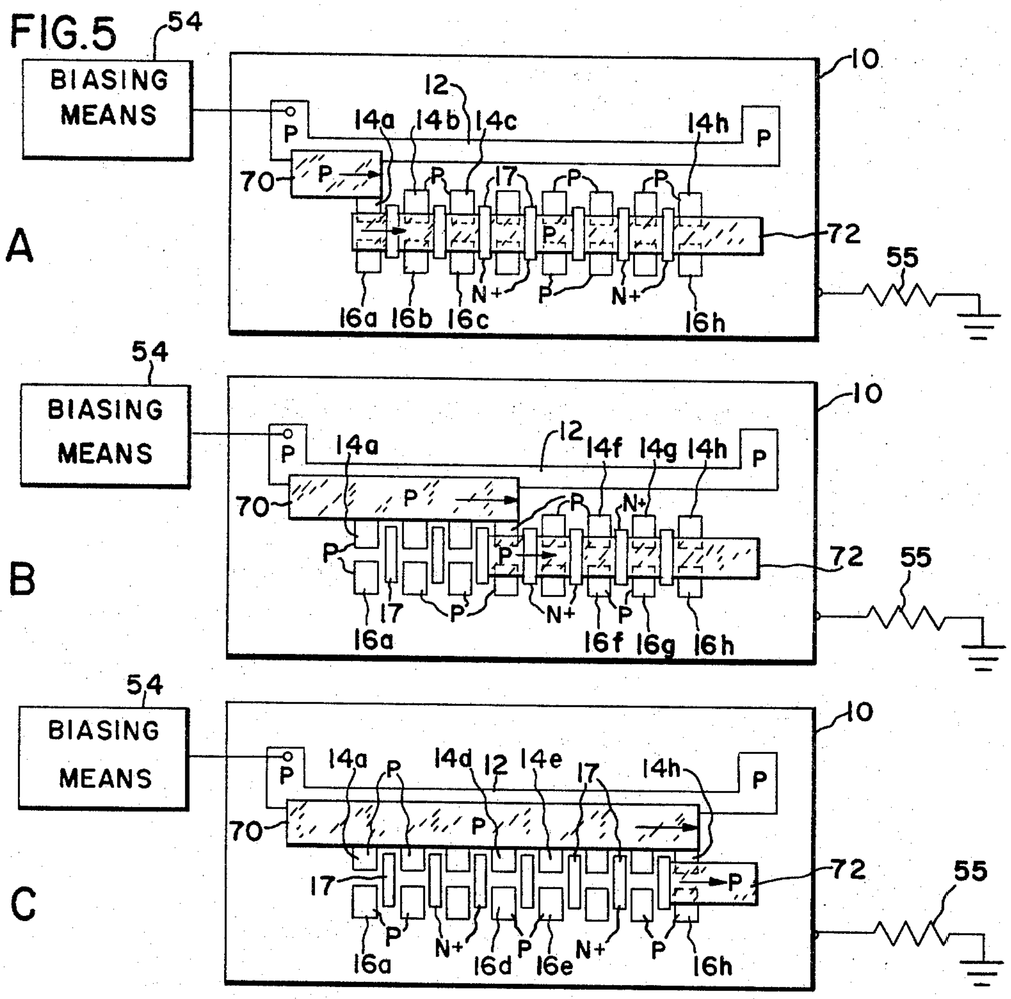

The operation of the invented device can be best understood by reference to FIGS. 1 and 5. For example, initially inversion plate 20 has a potential applied to it that creates an inversion region such as inversion region 70. The second inversion plate 22 has a potential applied to it that creates an inversion region such as region 72. From FIG. 5*a* it can be seen that inversion region 70 connects elongated region 12 and discrete region **14*a* and inversion region 72 connects discrete region 14*a*–14*b* with discrete regions 16*a*–16*b*. It should be noted that non-inverting region 17 isolates regions 14*a* and 16*a* from 14*b* and 16*b*, respectively, and so on. Thus, the P-type inversion regions are in overlapping relationship; a continuous P-type region is formed only at region 16*a* as a result of the effect of biasing means 54 on wafer 10. As the voltage means 32 applies its negatively increasing voltage to terminal 34 the inversion region 70 expands. Thus the inversion region 72 is contracted by the application of a positively increasing voltage to terminal 44 from voltage means 50. The contraction of region 72 is synchronized with the expansion of region 70 so that pairs of discrete regions 14 and 16 are sequentially and periodically connected to elongated region 12 and in turn to biasing means 54. This results in a current flowing through resistor 55** which is proportional to the discharge of the sampled junction. In FIG. 5*b*, this expansion and contraction of the inversion regions has progressed to sample the junction formed by discrete region **16*d* and wafer 10**; in FIG. 5*c* inversion region 70 has expanded to its fullest extent while inversion region 72 has fully contracted. In this condition the junction formed by discrete region **16*h* and wafer 10 is sampled. It should be appreciated that non-inverting regions 17 break up inversion region 72 so that when a particular one of discrete regions 16 is connected to biasing means 54, there is no substantial leakage to another discrete region 16**.

When this array is used as a photosensitive device with the discrete regions **16*a*–16*h* functioning as photosensitive diodes, then the device is operated in a storage mode of operation. In that mode, the light being sensed and converted into an electrical signal is incident to discrete regions 16*a*–16*h*. For purposes of explanation, it is sufficient to consider only one of these photosensitive diodes and its operation; the other diodes in the array operate in an identical manner. The photosensitive diode formed by region 16*a* and wafer 10 is first connected to reverse biasing means 54** to store a predetermined amount of charge in the junction capacitance (FIG. 5*a*). The region **16*a* is then disconnected from region 14*a* by the contraction of inversion region 72** (FIG. 5*b*). This in essence opens the MOS formed by wafer 10, regions **14*a*, 16*a*, insulating layer 18, and inversion plate 22. With the MOS open, a very high resistance is placed in circuit between wafer 10, regions 16*a* and 14*a*, plate 22 and biasing means 54. This insures that the RC circuit including the charged junction has a long time constant to minimize the effect of leakage current through region 14*a* or plate 22. The discharge of a charged junction occurs as a result of such leakage current or dark current and as a result of electron-hole pair generation induced by the light incident upon the junction. Thus, the value of the charge stored in the junction at some instant later is proportional to the light incident to the junction during the sampling period. As the sampling interval is increased, the sensitivity of the photosensitive junction is increased. It can now be appreciated that at some time later when the junction formed between regions 16*a* and 18 is again sampled, a current will flow through resistor 55** proportional to the discharge of the junction.

The storage mode of operation of photosensitive devices is generally known in the prior art, but to operate in this mode has required complex devices such as electron beam guns in order to sample the junctions. Prior to the subject device, the use of a directly connected switching means involved such leakage of the charge stored in the junction that the operation of the photosensitive device was substantially affected. The invented device solves the problem by employing a MOS in combination with the photosensitive diode and in particular a pair of MOS's. It has been found that this combination effectively isolates the photosensitive diode when it is not being sampled and facilitates high speed sampling. The sampling of the junctions may typically take place at frequencies ranging from 10 c.p.s. upwards. The capability to employ solid state switching devices to sample a storage mode photosensitive device makes possible microminiature, reliable and economical devices. In addition, it makes an array of such devices a possibility.

The provision of an array that is readily accessed is another important aspect of this invention. This is made possible with a minimum of complexity by the use of a pair of overlapping, contracting and expanding inversion layers to access groups of solid state devices and in particular photosensitive devices. The simplicity of the device is facilitated by a common elongated region, a pair of common inversion plates, and a plurality of non-inverting regions. These structural features contribute to providing a simple and practical arrangement requiring only six terminal connections to perform both the scanning and biasing function. It should be understood that a pair of overlapping traveling inversion layers to perform accessing or scanning has broad application beyond the specific use in a photosensitive array. In this respect, it can be seen that the voltage means, voltage gradient means, inversion plates, and insulating layer is means for forming a pair of traveling overlapping inversion regions and for selectively connecting separated junctions.

While there has been disclosed the novel features of the invention as applied to one embodiment, it will be apparent that various omissions and substitutions and changes in the form and details of the device and its operation may be made by those skilled in the art without departing from the spirit of the invention. It is the intention therefore to be limited only as indicated by the scope of the appended claims and the reasonable equivalence thereof.

What is claimed is:

1. An array of semiconductor devices, comprising:
a first plurality of PN junctions;
a second plurality of PN junctions; and
a means for selectively connecting at least one of the PN junctions from said first plurality with at least one of the PN junctions from said second plurality, said means including inversion means for forming a pair of traveling overlapping inversion regions.

2. An array of semiconductor devices, comprising:
a first plurality of PN junctions;
a second plurality of PN junctions; and
a monocrystalline semiconductor means for selectively connecting at least one of the PN junctions from said first plurality with at least one of the PN junctions from said second plurality, said means including means for forming a pair of traveling overlapping inversion regions.

3. An array of semiconductor devices, comprising:
an elongated PN junction;
a first plurality of PN junctions;
a second plurality of PN junctions; and
a monocrystalline semiconductor means for selectively connecting at least one of the PN junctions from said first plurality with at least one of the PN junctions from said second plurality and with said elongated PN junction, said means including means for forming a pair of traveling overlapping inversion regions.

4. An array of semiconductor devices, comprising:
a monocrystalline semiconductor wafer having a first conductivity type;
an elongated region of monocrystalline semiconductor material within said wafer having a conductivity type opposite to said wafer;
a first plurality of discrete regions of monocrystalline semiconductor material within said wafer having a conductivity type opposite to that of said wafer located adjacent said elongated region and separated therefrom;
a second plurality of discrete regions of monocrystalline semiconductor material within said wafer having a conductivity type opposite said wafer located adjacent said first plurality of discrete regions and separated therefrom;
a layer of insulating material overlying a substantial portion of said wafer including at least part of the elongated region, at least part of said first plurality of discrete regions and at least part of said second plurality of discrete regions;
a first inversion plate located intermediate said elongated region and said first plurality of discrete regions and separated therefrom by said insulating material;
a second inversion plate located intermediate said first plurality of discrete regions and said second plurality of discrete regions and separated therefrom by said insulating material; and
means for creating a pair of inversion regions having the same conductivity as said elongated region, said said first plurality of discrete regions and said second plurality of discrete regions beneath said first plate and said second plate, said inversion regions in overlapping relationship at least in the vicinity of one discrete region of said first plurality of discrete regions and one discrete region of said second discrete region, whereby a discrete region of said first plurality of discrete regions is connected to a discrete region of said second plurality of discrete regions.

5. An array of semiconductor devices, comprising:
a monocrystalline semiconductor wafer having a first conductivity type;
an elongated region of monocrystalline semiconductor material within said wafer having a conductivity type opposite to said wafer;
a first plurality of discrete regions of monocrystalline semiconductor material within said wafer having a conductivity type opposite to that of said wafer located along the length of said elongated region and separated therefrom;
a second plurality of discrete regions of monocrystalline semiconductor material within said wafer having a conductivity type opposite said wafer located adjacent said first plurality of discrete regions and separated therefrom;
a layer of insulating material overlying a substantial portion of said wafer including at least part of the elongated region, at least part of said first plurality of discrete regions and at least part of said second plurality of discrete regions;
a first inversion plate located intermediate said elongated region and said first plurality of discrete regions common to a multiplicity of discrete regions and separated therefrom by said insulating material;
a second inversion plate located intermediate said first plurality of discrete regions and said second plurality of discrete regions common to a multiplicity of said first and second discrete regions and separated therefrom by said insulating material; and
means for creating a pair of inversion regions having the same conductivity as said elongated region, said first plurality of discrete regions and said second plurality of discrete regions beneath said first plate and said second plate, said inversion regions in overlapping relationship at least in the vicinity of one discrete region of said first plurality of discrete regions and one discrete region of said second discrete region, whereby a discrete region of said first plurality of discrete regions is connected to a discrete region of said second plurality of discrete regions.

6. An array of semiconductor devices, comprising:
a monocrystalline semiconductor wafer having a first conductivity type;
an elongated region of monocrystalline semiconductor material within said wafer having a conductivity type opposite to said wafer;
a first plurality of discrete regions of monocrystalline semiconductor material within said wafer having a conductivity type opposite to that of said wafer located adjacent said elongated region and separated therefrom;
a second plurality of discrete regions of monocrystalline semiconductor material within said wafer having a conductivity type opposite said wafer located adjacent said first plurality of discrete regions and separated therefrom;
a layer of insulating material overlying a substantial portion of said wafer including at least part of said elongated region, at least part of said first plurality of discrete regions and at least part of said second plurality of discrete regions;
a first inversion plate located intermediate said elongated region and said first plurality of discrete regions and separated therefrom by said insulating material;
a second inversion plate located intermediate said first plurality of discrete regions and said second plurality of discrete regions and separated therefrom by said insulating material;
voltage gradient means for applying a potential gradient along one of said inversion plates with a potential approximately the inversion potential of said wafer at one point on said plate with a removed point at a potential substantially in excess of said inversion potential;
second voltage gradient means for applying a potential gradient along said other of said inversion plates with a potential in the proximity of the inversion potential at a point on said other plate adjacent and overlapping said one point on said one plate with the remainder of the other plate adjacent said one plate having a potential lower than said inversion potential;
first voltage means for applying a voltage to said one plate to progressively lower the potential applied along said one plate; and
second voltage means for applying a voltage to said other plate for progressively increasing the potential applied along said other plate, whereby overlapping expanding and contracting inversion regions are created beneath said inversion plates which controllably connect said elongated region, one of said regions from said first plurality of discrete regions and one of said regions from said second plurality of said discrete regions in series.

7. The structure defined in claim 6 wherein said wafer is silicon, said insulating material is silicon dioxide and said inversion plates are long, narrow rectangular members made from a resistor material.

8. The structure defined in claim 6 wherein said first and second voltage means generate ramp voltages of opposite polarity.

9. A solid state photosensitive device comprising:

a biasing means for supplying a reverse bias;

a solid state photosensitive diode;

a metal oxide switch connected to said photosensing diode and said biasing means to apply a reverse bias thereto when closed and to connect a very large resistance in circuit with said photosensitive diode when open, whereby a solid state photosensitive device that operates in a storage mode is formed.

10. A photosensitive device, comprising:

a solid state photosensitive diode;

a biasing means for reverse biasing said photosensitive diode and charging the capacitance incident to said diode when reverse biased; and a metal oxide silicon switch connected to said photosensitive diode and said biasing means to close when said photosensitive diode is to be recharged and to open when said photosensitive diode is detecting light, said metal oxide silicon switch having a very large resistance when closed which minimizes the effect of leakage current from the photosensitive diode during its light detecting operation, whereby the photodiode may effectively operated in a storage mode with a minimum of complexity.

11. A photosensitive device, comprising:

a plurality of solid state photosensitive diodes;

a biasing means for reverse biasing said photosensitive diodes and charging the capacitance incident to said diode when connected thereto;

a plurality of metal oxide silicon switches coupled to said photosensitive diode and said biasing means to close when said photosensitive diode is to be recharged and to open when said photosensitive diode is detecting light, said metal oxide silicon switches having a very large resistance when closed which minimizes the effect of leakage current from the photosensitive diode during its light detecting operation; and means for creating a traveling inversion region to sequentially close and open said switches, whereby the photodiodes may be effectively operated in a storage mode.

12. An array of semiconductor devices, comprising:

a monocrystalline semiconductor wafer having a first conductivity type;

an elongated region of monocrystalline semiconductor material within said wafer having a conductivity type opposite to said wafer;

a first plurality of discrete regions of monocrystalline semiconductor material within said wafer having a conductivity type opposite to that of said wafer located along the length of said elongated region and separated therefrom;

a second plurality of discrete regions of monocrystalline semiconductor material within said wafer having a conductivity type opposite to said wafer located adjacent said first plurality of discrete semiconductor regions and separated therefrom;

a plurality of non-inverting regions with at least one of said regions located between successive discrete regions and extending adjacent discrete regions of said first and second plurality;

a layer of insulating material overlying a substantial portion of said wafer including at least part of elongated region, at least part of said first plurality of discrete regions and at least part of said second plurality of discrete regions;

a first inversion plate located intermediate said elongated region and said first plurality of discrete regions and separated therefrom by said insulating material;

a second inversion plate located intermediate said first plurality of discrete regions and said second plurality of discrete regions and separated therefrom by said insulating material; and means for creating a pair of inversion regions having the same conductivity as said elongated region, said first plurality of discrete regions and said second plurality of discrete regions beneath said first plate and said second plate, said inversion regions in overlapping relationship at least in the vicinity of one discrete region of said first plurality of discrete regions and one discrete region of said second discrete region, whereby a discrete region of said first plurality of discrete regions is connected to a discrete region of said second plurality of discrete regions.

References Cited

UNITED STATES PATENTS

| | | | |
|---|---|---|---|
| 3,005,937 | 10/1961 | Wallmark et al. | 317—235 |
| 3,011,089 | 11/1961 | Reynolds | 307—88.5 |
| 3,154,720 | 10/1964 | Cooperman | 307—88.5 |
| 3,252,009 | 5/1966 | Weimer | 307—88.5 |
| 3,258,663 | 6/1966 | Weimer | 317—235 |

RALPH G. NILSON, *Primary Examiner.*

T. N. GRIGSBY, *Assistant Examiner.*